United States Patent
Gupta et al.

(10) Patent No.: US 9,570,222 B2
(45) Date of Patent: Feb. 14, 2017

(54) VECTOR INDUCTOR HAVING MULTIPLE MUTUALLY COUPLED METALIZATION LAYERS PROVIDING HIGH QUALITY FACTOR

(71) Applicant: TDK Corporation, Tokyo (JP)

(72) Inventors: Dev V. Gupta, Acton, MA (US); Mehdi Si Moussa, Acton, MA (US)

(73) Assignee: TDK Corporation, Tokyo (JP)

( * ) Notice: Subject to any disclaimer, the term of this patent is extended or adjusted under 35 U.S.C. 154(b) by 387 days.

(21) Appl. No.: 13/955,617

(22) Filed: Jul. 31, 2013

(65) Prior Publication Data

US 2014/0354377 A1 Dec. 4, 2014

Related U.S. Application Data

(60) Provisional application No. 61/828,107, filed on May 28, 2013, provisional application No. 61/857,446, filed on Jul. 23, 2013.

(51) Int. Cl.
*H03H 7/09* (2006.01)
*H01F 17/00* (2006.01)
(Continued)

(52) U.S. Cl.
CPC ............ *H01F 17/0013* (2013.01); *H01G 4/38* (2013.01); *H01G 4/40* (2013.01); *H01G 5/38* (2013.01);
(Continued)

(58) Field of Classification Search
CPC ..... H01F 17/0013; H03H 7/0115; H03H 7/09; H03H 7/0138; H03H 17/0013
(Continued)

(56) References Cited

U.S. PATENT DOCUMENTS 4,363,009 A 12/1982 Malcolm et al.
4,423,396 A 12/1983 Makimoto et al.
(Continued)

FOREIGN PATENT DOCUMENTS

CN 105340176 A 2/2016
CN 105408971 A 3/2016
(Continued)

OTHER PUBLICATIONS

Invitation to Pay Additional Fees with Communication Relating to the Results of the Partial International Search mailed Jun. 10, 2014 in counterpart International Application No. PCT/US2014/018611 in 6 pages.
(Continued)

*Primary Examiner* — Robert Pascal
*Assistant Examiner* — Rakesh Patel
(74) *Attorney, Agent, or Firm* — Nixon Peabody LLP

(57) ABSTRACT

An inductor component includes a plurality of conductive elements, each formed as an individual patch of conductive material, with the conductive elements arranged in a vertical stack and tightly coupled to one another. Dielectric is disposed between more adjacent conductive elements, the dielectric has a permittivity and is sufficiently thin so as to provide a mutual inductance factor of at least one-half or greater between adjacent ones of the conductive elements. The dielectric is typically thinner than the adjacent conductors.

17 Claims, 10 Drawing Sheets

(51) Int. Cl.
| | |
|---|---|
| *H03H 7/01* | (2006.01) |
| *H03H 7/38* | (2006.01) |
| *H01G 5/38* | (2006.01) |
| *H01G 4/38* | (2006.01) |
| *H01L 23/64* | (2006.01) |
| *H01L 27/08* | (2006.01) |
| *H01G 4/40* | (2006.01) |
| *H03H 5/00* | (2006.01) |
| *H03H 7/48* | (2006.01) |
| *H03H 11/12* | (2006.01) |
| *H01L 49/02* | (2006.01) |

(52) U.S. Cl.
CPC ......... *H01L 23/642* (2013.01); *H01L 27/0811* (2013.01); *H03H 7/01* (2013.01); *H03H 7/0115* (2013.01); *H03H 7/0138* (2013.01); *H03H 7/09* (2013.01); *H03H 7/38* (2013.01); *H01F 2017/0026* (2013.01); *H01L 28/10* (2013.01); *H01L 2224/32225* (2013.01); *H01L 2224/48091* (2013.01); *H01L 2224/48227* (2013.01); *H01L 2224/48465* (2013.01); *H01L 2224/83385* (2013.01); *H01L 2924/0002* (2013.01); *H01L 2924/15311* (2013.01); *H03H 5/003* (2013.01); *H03H 7/0153* (2013.01); *H03H 7/48* (2013.01); *H03H 11/1291* (2013.01); *H03H 2210/025* (2013.01); *H03H 2210/036* (2013.01); *H03H 2240/00* (2013.01)

(58) Field of Classification Search
USPC .................................. 336/200; 333/175, 185
See application file for complete search history.

(56) References Cited

U.S. PATENT DOCUMENTS

| | | | |
|---|---|---|---|
| 4,456,895 A | 6/1984 | Landt et al. | |
| 4,754,242 A * | 6/1988 | Okamura | H03H 7/0115 333/175 |
| 4,878,151 A | 10/1989 | Gallichio | |
| 5,208,597 A | 5/1993 | Early et al. | |
| 5,227,746 A * | 7/1993 | Esaki | H03H 1/0007 333/184 |
| 5,321,597 A | 6/1994 | Alacoque | |
| 5,452,178 A | 9/1995 | Emesh et al. | |
| 5,530,415 A | 6/1996 | Takaya et al. | |
| 5,543,751 A | 8/1996 | Stedman et al. | |
| 5,621,366 A | 4/1997 | Gu et al. | |
| 6,124,624 A | 9/2000 | Van Roosmalen et al. | |
| 6,198,374 B1 * | 3/2001 | Abel | 336/200 |
| 6,211,745 B1 | 4/2001 | Mucke et al. | |
| 6,293,001 B1 | 9/2001 | Uriu et al. | |
| 6,410,954 B1 | 6/2002 | Sowlati et al. | |
| 6,437,677 B1 | 8/2002 | Takeuchi et al. | |
| 6,438,000 B1 * | 8/2002 | Okamoto et al. | 363/40 |
| 6,472,960 B1 * | 10/2002 | Ishikawa et al. | 333/204 |
| 6,608,538 B2 * | 8/2003 | Wang | 333/204 |
| 6,657,509 B1 | 12/2003 | Ohannes | |
| 6,664,882 B2 | 12/2003 | Andoh et al. | |
| 6,765,778 B1 | 7/2004 | Du et al. | |
| 6,882,548 B1 | 4/2005 | Jacobs et al. | |
| 6,940,386 B2 | 9/2005 | Mukherjee et al. | |
| 7,000,000 B1 | 2/2006 | O'Brien | |
| 7,023,316 B2 * | 4/2006 | Ahn | H01L 23/5227 257/E21.022 |
| 7,212,789 B2 | 5/2007 | Kuffner | |
| 7,245,519 B2 | 7/2007 | McQuirk et al. | |
| 7,251,121 B2 | 7/2007 | Bhutta | |
| 7,253,704 B2 | 8/2007 | Park et al. | |
| 7,255,801 B2 | 8/2007 | Chen | |
| 7,280,001 B2 | 10/2007 | Maligeorgos et al. | |
| 7,439,828 B2 | 10/2008 | Wada | |
| 7,446,628 B2 | 11/2008 | Morris, III | |
| 7,453,136 B2 | 11/2008 | Hakkarainen et al. | |
| 7,528,667 B1 | 5/2009 | Tan et al. | |
| 7,576,627 B2 | 8/2009 | Shastry et al. | |
| 7,586,389 B2 | 9/2009 | Ali-Ahmed et al. | |
| 7,656,251 B1 | 2/2010 | Bauder et al. | |
| 7,692,527 B2 | 4/2010 | Ito et al. | |
| 7,719,083 B2 | 5/2010 | Chang | |
| 7,728,427 B2 | 6/2010 | Gabara | |
| 8,134,222 B2 | 3/2012 | Khan et al. | |
| 8,203,419 B2 | 6/2012 | Nazarian et al. | |
| 8,204,031 B2 | 6/2012 | Jian et al. | |
| 8,289,103 B2 * | 10/2012 | Yamakawa | H03H 7/0115 333/174 |
| 8,289,118 B2 | 10/2012 | Chiu et al. | |
| 8,324,069 B1 | 12/2012 | Carns et al. | |
| 8,324,692 B2 | 12/2012 | Chen et al. | |
| 8,324,984 B2 | 12/2012 | Gavin et al. | |
| 8,395,880 B2 | 3/2013 | Wasson | |
| 8,531,862 B2 | 9/2013 | Roest et al. | |
| 8,760,241 B1 | 6/2014 | Ashworth et al. | |
| 9,019,007 B2 | 4/2015 | Gupta et al. | |
| 9,086,709 B2 | 7/2015 | Gupta et al. | |
| 9,110,483 B2 | 8/2015 | Madan et al. | |
| 9,201,442 B2 | 12/2015 | Gupta et al. | |
| 2002/0158305 A1 | 10/2002 | Dalmia et al. | |
| 2003/0122619 A1 | 7/2003 | Ishida et al. | |
| 2004/0066244 A1 | 4/2004 | Takinami et al. | |
| 2004/0070468 A1 | 4/2004 | Harada | |
| 2004/0140528 A1 | 7/2004 | Kim et al. | |
| 2004/0164836 A1 | 8/2004 | Wang et al. | |
| 2005/0012567 A1 | 1/2005 | Liu | |
| 2005/0030116 A1 | 2/2005 | Takagi | |
| 2005/0064159 A1 * | 3/2005 | Amou | H05K 1/032 428/209 |
| 2005/0116797 A1 | 6/2005 | Shamsaifar et al. | |
| 2005/0162234 A1 * | 7/2005 | Kobayashi | C04B 35/2625 331/181 |
| 2005/0184812 A1 | 8/2005 | Cho | |
| 2005/0237131 A1 * | 10/2005 | Chang et al. | 333/175 |
| 2006/0006431 A1 | 1/2006 | Jean et al. | |
| 2006/0043499 A1 | 3/2006 | De Cremoux et al. | |
| 2006/0077020 A1 | 4/2006 | Wang et al. | |
| 2006/0103456 A1 | 5/2006 | Azimi et al. | |
| 2008/0042771 A1 | 2/2008 | Han et al. | |
| 2008/0048236 A1 | 2/2008 | Kim | |
| 2009/0033439 A1 * | 2/2009 | Igarashi | H03H 7/0115 333/185 |
| 2009/0128992 A1 | 5/2009 | Haralabiois et al. | |
| 2009/0179713 A1 | 7/2009 | Zeng et al. | |
| 2009/0179722 A1 * | 7/2009 | Goyette et al. | 336/186 |
| 2009/0243743 A1 | 10/2009 | Kossel et al. | |
| 2009/0273416 A1 | 11/2009 | Nakatsuka et al. | |
| 2010/0039189 A1 | 2/2010 | Taniguchi | |
| 2010/0052778 A1 | 3/2010 | Baranauskas | |
| 2010/0285769 A1 | 11/2010 | Conroy et al. | |
| 2011/0002080 A1 | 1/2011 | Ranta | |
| 2011/0109380 A1 | 5/2011 | Park et al. | |
| 2011/0187487 A1 | 8/2011 | Hsu et al. | |
| 2011/0309994 A1 | 12/2011 | Kato et al. | |
| 2012/0146742 A1 | 6/2012 | Caron et al. | |
| 2012/0193771 A1 | 8/2012 | Masuda | |
| 2012/0208473 A1 | 8/2012 | Aparin | |
| 2013/0039228 A1 | 2/2013 | Caron | |
| 2013/0083703 A1 | 4/2013 | Granger-Jones et al. | |
| 2013/0090080 A1 | 4/2013 | Schmidt | |
| 2013/0093703 A1 | 4/2013 | Yang et al. | |
| 2013/0099864 A1 | 4/2013 | Kawai et al. | |
| 2013/0169378 A1 | 7/2013 | Kim et al. | |
| 2013/0200980 A1 * | 8/2013 | Yokoyama | H01F 27/292 336/200 |
| 2013/0257558 A1 | 10/2013 | Kim et al. | |
| 2014/0009211 A1 | 1/2014 | Madan et al. | |
| 2014/0266502 A1 | 9/2014 | Gupta et al. | |
| 2014/0285286 A1 | 9/2014 | Bojer | |
| 2014/0285299 A1 | 9/2014 | Bojer | |
| 2014/0354348 A1 | 12/2014 | Gupta et al. | |
| 2014/0354370 A1 | 12/2014 | Gupta et al. | |
| 2014/0355171 A1 | 12/2014 | Gupta et al. | |
| 2014/0355172 A1 | 12/2014 | Gupta et al. | |

(56) References Cited

U.S. PATENT DOCUMENTS

| | | |
|---|---|---|
| 2015/0130532 A1 | 5/2015 | Madan et al. |
| 2015/0205318 A1 | 7/2015 | Gupta et al. |
| 2015/0236014 A1 | 8/2015 | Gathman |
| 2016/0161970 A1 | 6/2016 | Gupta et al. |
| 2016/0163464 A1 | 6/2016 | Madan et al. |
| 2016/0163697 A1 | 6/2016 | Madan et al. |
| 2016/0164481 A1 | 6/2016 | Madan et al. |
| 2016/0164482 A1 | 6/2016 | Madan et al. |
| 2016/0164484 A1 | 6/2016 | Madan et al. |
| 2016/0164492 A1 | 6/2016 | Madan et al. |

FOREIGN PATENT DOCUMENTS

| | | |
|---|---|---|
| CN | 105453424 A | 3/2016 |
| EP | 0 581 702 A1 | 2/1994 |
| EP | 0 716 468 B1 | 10/2001 |
| EP | 0 780 853 B1 | 9/2002 |
| EP | 1 260 998 A1 | 11/2002 |
| EP | 2 392 382 A1 | 12/2011 |
| JP | 63-308366 A | 12/1988 |
| JP | 2006-128468 A | 5/2006 |
| WO | WO 2013/028546 A1 | 2/2013 |
| WO | 2014/193502 A1 | 12/2014 |
| WO | 2014/193845 A1 | 12/2014 |
| WO | WO 2014/193501 A1 | 12/2014 |
| WO | WO 2016/089532 A1 | 6/2016 |
| WO | WO 2006/099419 A1 | 9/2016 |

OTHER PUBLICATIONS

Leifso et al., "A Fully Integrated Actice Inductor with Independent Voltage Tunable Inductance and Series-Loss Resistance," IEEE Transactions on Microwave Theory and Techniques, vol. 49, No, 4, Apr. 2001, 7 pages.

International Search Report and Written Opinion dated Aug. 26, 2014 for International Application No. PCT/US2014/018611, filed on Feb. 26, 2014. 20 pages.

Invitation to Pay Additional Fees with Communication Relating to the Results of the Partial International Search mailed Nov. 6, 2014 in International Application No. PCT/US2014/039595 in 9 pages.

PCT Search Report and Written Opinion of Jan. 20, 2015 for International Application No. PCT/US2014/039595, filed on May 27, 2014. 24 pages.

Han Q. et al., "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Kampe, A. et al., "An LC-VCO with one octave tuning range," IEEE European Conference on Circuit Theory and Design, vol. 3, Aug. 29, 2005, pp. 321-324.

Ming-Jer, Chen et al., "A Novel Cross-Coupled Inter-Poly-Oxide Capacito for Mixed-Mode CMOS Processes", IEEE Electron Device Letters, vol. 20, No. 7, Jul. 1999, 3 pages.

Nakamura, T. et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.

Ou Hok Huor et al., "Design of Super High Power Saw Filter", IEEE Ultrasonics Symposium 1991, vol. 1, Dec. 8, 1991, pp. 161-166.

Pietro Andreani et al., "On the Use of MOS Varactors in RF VCO's", IEEE Journal of Solid-State Circuits, vol. 35, No. 6, Jun. 2000, pp. 905-910.

Sauerbrey J. et al., "A 0.7-V MOSFET-Only Switched-Opamp Sigmadelta Modulator in Standard Digital CMOS Technology", IEEE Journal of Solid-State Circuits, vol. 37, No. 12, Dec. 2002, pp. 1662-1669.

Zhiqiang et al., "A Multi-Band RF CMOS LC Bandpass Filter with Continuous Frequency Tuning Design," 2010 International Conference on Computer Application and System Modeling (ICCASM 2010), 4 pages.

Corrected Notice of Allowance in U.S. Appl. No. 14/288,127, mailed Jan. 21, 2016.

International Preliminary Report on Patentability for PCT Application No. PCT/US2014/018555, dated Dec. 1, 2015.

International Preliminary Report on Patentability for PCT Application No. PCT/US2014/018611, dated Dec. 1, 2015.

International Preliminary Report on Patentability for PCT Application No. PCT/US2014/039595, dated Dec. 1, 2015.

International Search Report and Written Opinion for PCT Application No. PCT/US2015/059018, mailed Feb. 19, 2016.

International Search Report and Written Opinion for PCT Application No. PCT/US2014/018555, mailed Jun. 20, 2014.

Notice of Allowance in U.S. Appl. No. 14/025,069, mailed May 6, 2016.

Notice of Allowance in U.S. Appl. No. 14/288,127, mailed Dec. 22, 2015.

Office Action in U.S. Appl. No. 14/025,069, mailed Jun. 4, 2015.
Office Action in U.S. Appl. No. 14/025,069, mailed Oct. 19, 2015.
Office Action in U.S. Appl. No. 14/559,785, mailed Apr. 6, 2015.
Office Action in U.S. Appl. No. 14/559,785, mailed Dec. 4, 2015.
Office Action in U.S. Appl. No. 14/559,785, mailed Jun. 19, 2015.
Office Action in U.S. Appl. No. 14/559,785, mailed Mar. 31, 2016.

* cited by examiner

VECTOR INDUCTOR HAVING MULTIPLE MUTUALLY COUPLED METALIZATION LAYERS PROVIDING HIGH QUALITY FACTOR

CROSS REFERENCE TO RELATED APPLICATIONS

This application claims the benefit of the filing dates of two U.S. Provisional Patent Applications entitled "Tunable Passive Filter Components", Ser. No. 61/828,107 filed May 28, 2013, and "Signal Handling Apparatus for Radio Frequency Circuits", Ser. No. 61/857,446 filed Jul. 23, 2013, the entire contents of each of which are hereby incorporated by reference.

BACKGROUND

Technical Field

This patent application relates to inductors, and more specifically to a vector inductor that provides very high quality factor in a small form factor.

Background Information

An inductor is a passive, two-terminal electrical component which temporarily stores electrical energy when a current passes through it. When the current flowing through an inductor changes over time, the resulting time varying magnetic field induces a voltage. An inductor may be characterized by its inductance, the ratio of this voltage to the rate of change of the current.

Inductors are commonly used in many different types of alternating current (AC) circuits, and especially radio frequency (RF) circuits. Inductors are combined with capacitors and other components to implement filters, resonators, tuners, and other functions. Electronic devices such as smart phones, tablets, laptop computers, and the like are now typically expected to use many different radio communication protocols and operate over a wide variety of frequencies, while at the same time being as small and inexpensive as possible. Inductor design becomes a critical aspect of achieving these goals.

SUMMARY

Problem Description

The quality, or Q, factor is a dimensionless parameter that characterizes an inductor in terms of the ratio between the inductance and the resistance of the component. In RF design, Q is commonly considered to characterize a resonant circuit's bandwidth relative to its center frequency. Higher Q indicates a lower rate of energy loss relative to the stored energy. Resonators with higher Q factors are therefore desired for implementations where bandwidth relative to center frequency must be increased. The need for high Q is therefore characteristic of present day communication devices, which must handle higher and higher data rates. A high Q tuned circuit also provides greater selectivity; that is, it does a better job of filtering out signals from adjacent channels. High Q oscillators also resonate within a smaller range of frequencies and are therefore more stable.

An additional concern with component design is the physical space that it occupies. Any approach that can increase a given amount of inductance available in a certain amount of circuit area, while also improving Q, would generally be preferred.

If a set of inductors is needed for a particular integrated circuit (IC)-based design, the use of discrete inductors that are separate from the ICs may give rise to implementation problems due to the need to make many interconnections between the set of inductors and the other components. This situation has motivated many circuit designers in the direction of integrating as many of the needed inductors as possible into the semiconductor device itself.

However, the integration of an inductor into an IC creates other problems due to an inductor's inherent magnetic properties. IC inductors can be implemented using a conductor that adopts a "coil" or "spiral" shape as used in classic discrete inductor components. Because the path for current flow in such structures is necessarily curved or angled, the induced magnetic fields tend to force electrons along the shortest possible path (that is, along the innermost edges) of the spiral conductive path. This in turn limits the ability to improve the inductor's Q with increasing frequency.

As a result, it is generally believed that one must increase the size of the conductive path must be increased, or the magnetic coupling between adjacent turns, to provide increased Q.

Spiral shaped inductors are therefore believed to be less than ideal for providing high Q where the inductor must be as small as possible.

Inductors can also be implemented with active circuit components including transistors. But active circuit based inductors bring other challenges in terms of linearity.

SUMMARY OF PREFERRED SOLUTION(S)

The above-mentioned and other related problems motivate aspects of the present invention, a vector inductor component that exhibits very high Q in a small form factor that is easily incorporated into IC-based and printed circuit board designs.

In one arrangement, the vector inductor includes a plurality of conductive elements, each formed as an individual strip or patch of conductive material. The conductive elements are arranged in a vertical stack and tightly coupled to one another. A dielectric is provided between each pair of adjacent conductive elements in the stack. The dielectric has a permittivity and is sufficiently thin so as to provide a mutual inductance factor of at least one-half or greater, and preferably approaches 0.9 or higher between adjacent conductive elements. The high mutual conductance may be realized by constructing the dielectric to be very thin, typically at least thinner than the adjacent conductors.

The dielectric disposed between the two or more conductive elements may exhibit a dielectric loss tangent ($T_{and}$) much less than 1.

The conductors may be connected to one another in a case where the inductor is to serve as a discrete component. Where the inductor is to be included as part of a parallel or series LC resonant circuit, the inductor may be directly connected to a capacitor via only a top conductive element and a bottom conductive element in the vertical stack.

In one configuration the inductor comprises multiple subassemblies, with each subassembly including (i) a given one of the dielectric layers provided by a printed circuit board substrate, and (ii) two conductors as a metal strip disposed on either side of the is substrate. The inductor is then formed of multiple subassemblies attached to one another via adhesive layers.

The conductors are generally a rectangular strip of metal having at least two parallel side walls extending from the input end to the output end to encourage maximum current flow, avoiding curved or angular paths. This ensures that the conductive field path is as straight as possible from an input end to an output end.

BRIEF DESCRIPTION OF THE DRAWINGS

The detailed description below refers to the accompanying drawings, of which.

DETAILED DESCRIPTION OF AN ILLUSTRATIVE EMBODIMENT

Briefly, the preferred design for a vector inductor uses tightly coupled, layered sets of conductive patches formed on and/or within a printed circuit board substrate. The tightly coupled conductors exhibit a high mutual inductance factor, at least one-half or preferably even 0.9 or higher. In one example embodiment, N mutually coupled inductors of inductance L with this very tight coupling are fit into an area of size 1/N as compared to the size occupied by one uncoupled inductor (of value N*L). This results in a total reduction factor of $N^2$ in size for an inductor of inductance L. For N=16, the reduction in size is therefore 256 times smaller than an uncoupled, non-layered inductor.

Figure 1:
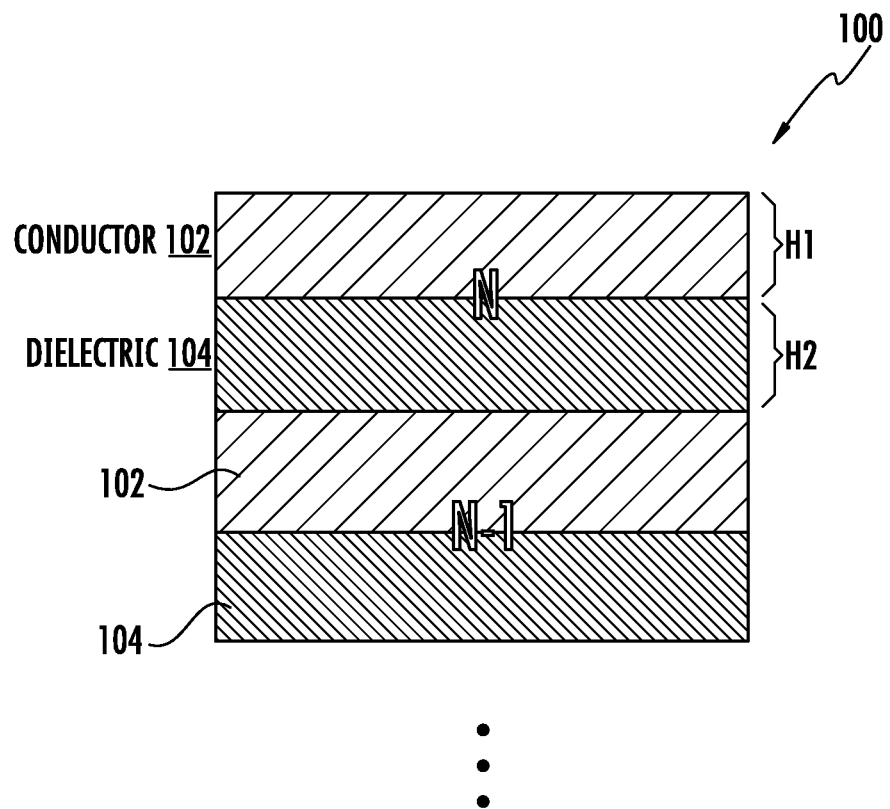
FIG. 1 is a cross section view of a vector inductor formed of stacked conductors and dielectric layers.
Figure 1:
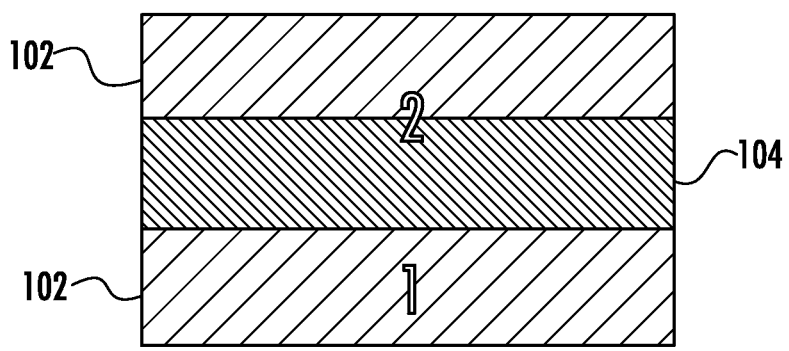

FIG. 1 is a high level cross section view of one such vector inductor 100 formed from multiple, closely spaced patches of conductive material, referred to as the conductors 102 herein. The N conductors 102 may be formed as separate copper layers disposed on and/or within a printed circuit board substrate. The conductors 102 are aligned with one another vertically, and spaced apart from one another by multiple dielectric layers 104. For a vector inductor of N conductors 102, there would be N−1 dielectric layers 104.

The dielectric layers 104 may include any suitable dielectric material and/or an adhesive layer such as epoxy. In an implementation where the conductors are mechanically suspended at the ends, the dielectric may even be air.

The layer thicknesses in FIG. 1 are not shown to scale. To encourage mutual coupling, the thickness of the dielectric layers 104 is typically less than the thickness of the conductors 102. In one example implementation the conductor 102 thickness (or height H1) might be about 0.33 mils for a quarter-ounce copper patch conductor (0.67 for half-ounce copper) but the dielectric 104 thickness might be only 0.1 mils. In general, the thickness of the various dielectric layers 104 will be the same, although it is possible that some of the dielectric layers are thicker or thinner than others. Quarter-ounce and half-ounce refer to the industry standard terminology for metal thickness in printed circuit board structures.

Figure 2:
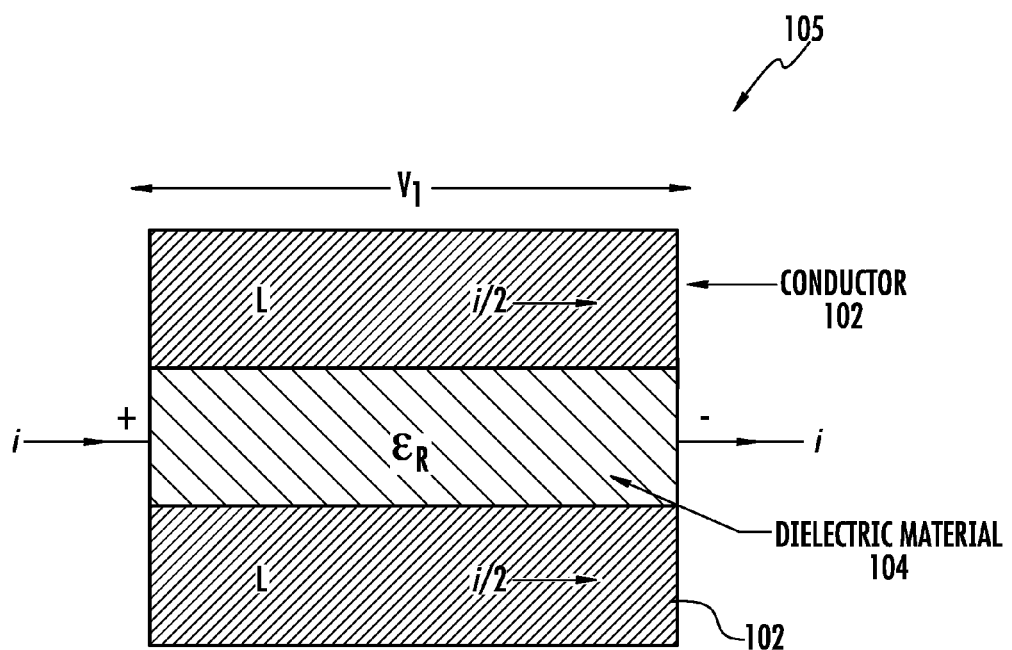
FIG. 2 is a more detailed cross section view of a portion of the vector inductor.

FIG. 2 shows a more detailed view of one subassembly or section 105 of the vector inductor 100, including two adjacent conductors 102 and the dielectric 104 disposed between them. The dielectric 104 has a relative permittivity $\epsilon_r$. It can be shown that the following equation models the resulting relationship of voltage and current:

$$V_1 = L\frac{d\frac{i}{2}}{dt} + M\frac{d\frac{i}{2}}{dt} = \left(\frac{L}{2} + \frac{M}{2}\right)\frac{di}{dt}$$

where L is the inductance of each conductor 102, i is the total current flowing through the section (such that each conductor 102 carries a current of i/2) and we can conclude that:

$$V_1 = \left(\frac{L}{2} + \frac{kL}{2}\right)\frac{di}{dt} \approx L\frac{di}{dt} \text{ for } k \approx 1$$

where $V_1$ is the voltage across the inductor structure section 105, and M is a mutual inductance factor given by $$M = k\sqrt{L_1 L_2} = kL \text{ because } L_1 = L_2 = L$$

where $L_1$ is the inductance of a first layer, and $L_2$ is the inductance of the second layer.

Therefore, this relation will hold true when the mutual inductance is relatively high, such that the mutual inductance factor k is at least 0.5 and preferably approaches 0.90 or higher.

It should be noted that in comparing the closely coupled inductor pair architecture of FIG. 2 to a simple metal strip, the real resistance of the inductor is halved, while the total inductance has not changed. The result is that the quality factor Q is doubled while the total inductance remains at approximately L. for a given area. For a single pair of conductors 102 as shown in FIG. 2, a Q of about 150 is possible.

The material chosen for dielectric 104 disposed between each conductive element 102 is such that it exhibits a dielectric loss tangent ($T_{and}$) much less than 1, typically approaching something less than or equal to $2e^{-5}$.

Figure 3A:
FIGS. 3A and 3B are top views of two different shapes for the conductors.
Figure 3B:
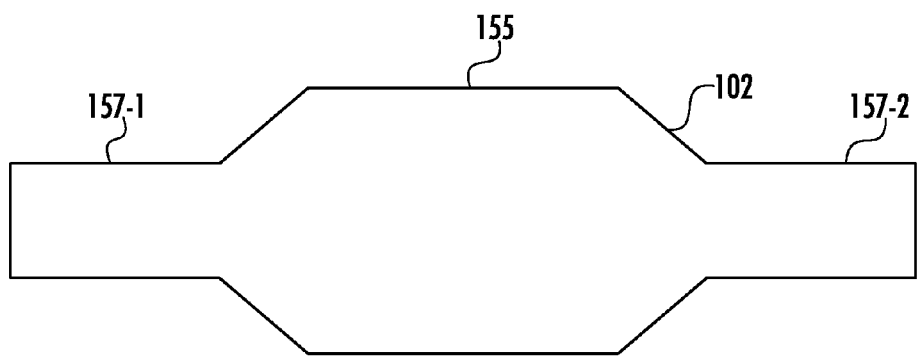

The conductors 102 may assume various shapes; again, what is important is that the conductors 102 are tightly coupled to one another. FIG. 3A is a top view of one possible implementation of the conductors 102. Here, the conductor 102 is shaped as an elongated rectangle or "strip" of metal. This rectangular strip shape provides the straightest possible path for electric field propagation by eliminating any curves or angles. This in turn, maximizes the quality factor for a given configuration. However, other shapes for conductors 102 may also be sufficient to meet the requirements herein of increased Q. One such possible shape, shown in FIG. 3B, still has a still generally a rectangular main conductive portion 155, but now having stub sections 157-1, 157-2 on each opposing end. The stub sections 157-1, 157-2 can assist with impedance matching to adjacent components and/or circuit connections. What is important is to avoid forcing current to flow along a curved propagation paths through the conductor 102, as well as sharp angles in the sidewalls of any shapes that deviate from the rectangular as much as possible.

A "skin effect" of radio frequency signals propagating via a conductor such as a conductive patch 102 causes currents to generally flow on or near the surface or edges, rather than through the entire thickness of the conductor 102. Increasing the thickness of the conductor 102 thus will not have any appreciable affect on the amount of current carried, or the resistance experienced by the signal propagating through the conductor. This skin effect thus normally limits the ability to increase the Q and the total inductance in an inductor 102 formed from strips of conductive material.

Figure 4:
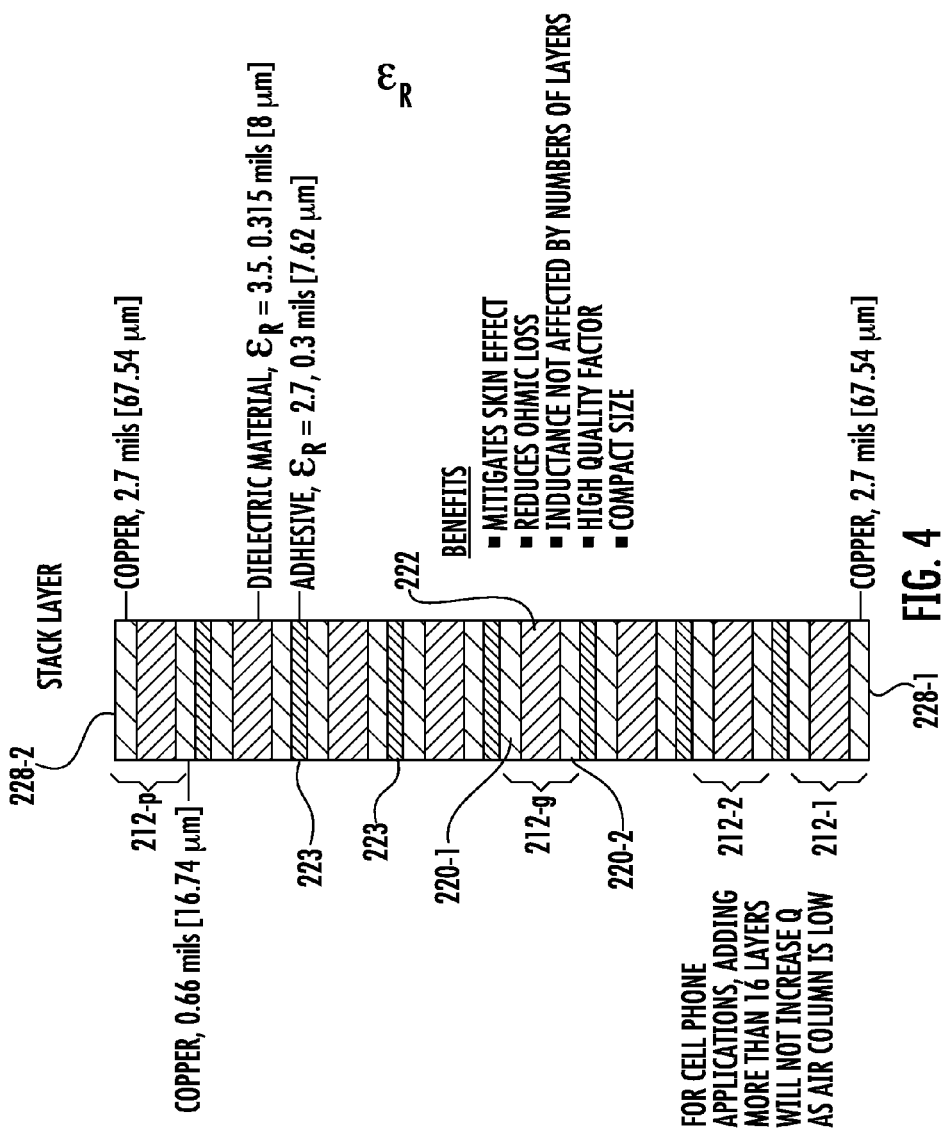
FIG. 4 is a more detailed cross section view of a specific embodiment of the vector inductor formed of multiple printed circuit board subassemblies adhered together.

However, the inductor pair configuration of FIG. 2 can be extended to a multiple layer vector inductor configuration shown in FIG. 4. Here, a number, P, of closely coupled inductor pairs or subassemblies 212-1, 212-2, ..., 212-g, ..., 212-P are stacked together. As with the embodiments of FIGS. 1 and 2, an example inductor element 212-g is formed as a pair of conductive material patches 220-1, 220-2 disposed on either side of a dielectric 222. Here the dielectric 222 may be formed of the "A-stage" material" of a printed circuit board substrate with the conductors 220-1, 220-2 being copper patches disposed on the respective top and bottom sides thereof. The resulting P subassembly constructions are arranged vertically with respect to one another and adhered to one another using "B-stage" material such as an epoxy adhesive 223.

Stacking multiple inductor pairs 212 in this way to form the vector inductor 100 forces at least some of the currents to flow though the conductors 220 in the middle of the structure in addition to the skin effect on the outermost conductor layers 228-1, 228-2. This improves the overall conductivity of the vector inductor 100 as compared to a single solid conductor of the same dimension.

An adhesive layer 223 is disposed between adjacent ones of the inductor pairs 212; the adhesive 223 is chosen to be relatively thin and have a relatively low static relative permittivity (dielectric constant) $\epsilon_r$ so that a given inductor pair 212-g will exhibit tight coupling to its neighboring inductor pair located immediately above (inductor pair 212-g−1) and below (inductor pair 212-g+1).

Mutual coupling of the overall vector inductor structure is determined by the distance between the layers and the dielectric constant of the materials disposed between the conductors. FIG. 4 shows some typical dimensions. For an internal conductive layer 220 thickness (or height) of approximately 0.66 mils (16.74 μm) and dielectric substrate layers 222 of approximately 0.315 mils (8 μm), one would prefer to have an $\epsilon_r$ of the dielectric substrate of about 3.5 and an $\epsilon_r$ of the adhesive layers 223 of about 2.7 (if the adhesive 223 is 0.3 mils (7.62 μm) thick). Again, the total dielectric layer thickness is less than the thickness of the conductive layers.

The outermost conductors 228-1, 228-2 may preferably be somewhat thicker than that of the internal conductive layers 220—here the outer conductors may be 2.7 mils (67.54 μm) thick.

It is preferred that each conductor 220 has the same size and shape as the adjacent conductors 102 (and indeed all other internal conductors 220) in the stack that make up the vector inductor structure. However, variations in the size and shape of the individual conductors would not depart from the spirit of the design.

The stacked inductor design of FIG. 4 provides important advantages over other approaches. Normally, a structure that includes P independent inductors of value L would consume a space that is P times larger than the space consumed by the single inductor L. However, in the case of the mutually coupled vector inductors of FIG. 4, the P mutually coupled inductors of size L, provided with very tight coupling, only requires a space of size 1/P, as compared to the space that would be occupied by a single uncoupled inductor (of value P*L). The total reduction in size is thus $P^2$ where N is the number of inductor pairs. Thus if P equals 16, the corresponding reduction in size is 256 times smaller than the case of the single inductor.

Tightly coupled vector inductors with mutual inductance of 0.95 or higher shown herein in tend to provide great improvement in the available Q factor, achieving a Q of 200 or more.

Figure 5A:
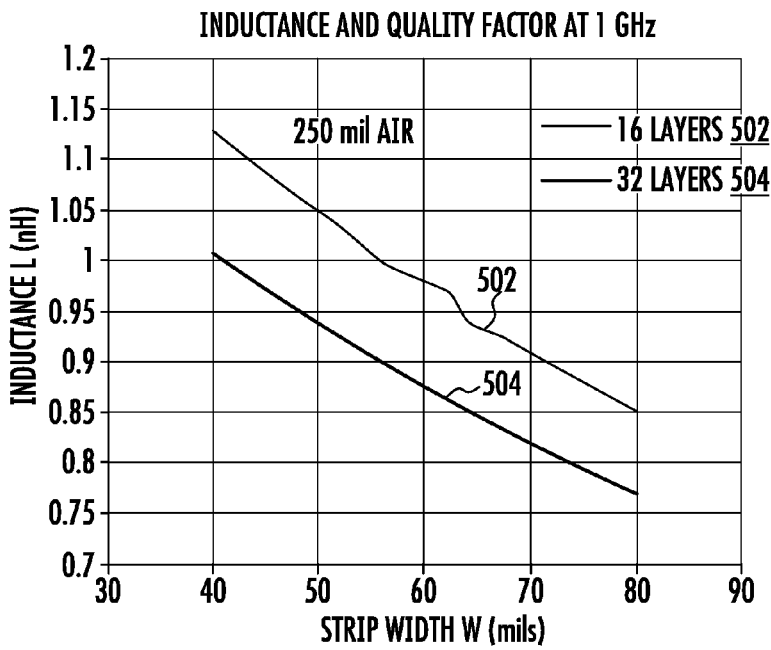
FIGS. 5A and 5B show modeled inductance and quality factor of the vector inductor for 16 and 32 stacked elements at 1 GigaHertz (GHz)
Figure 5B:
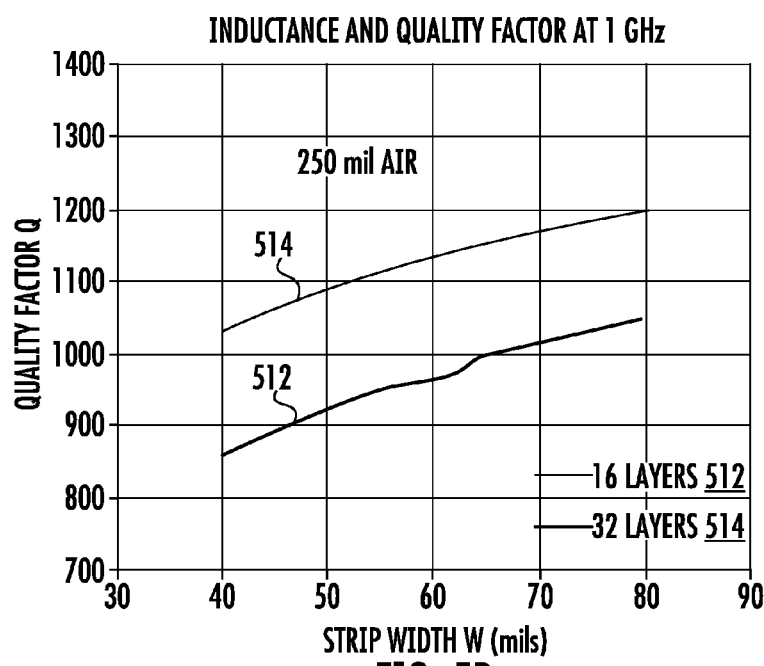

FIGS. 5A and 5B, respectively, show modeled inductance and quality factor provided at an operating frequency of 1 GHz for different conductive patch widths (in mils) and for two different numbers of inductor pairs (P=16 and P=32). The model assumed that a 250 mil thick air column is provided adjacent the top and bottom outer conductor layers 228-1, 228-2.

Curve 502 in FIG. 5A shows modeled inductance varying as a function of the width of rectangular conductor strips 220 for the number of layers, P=16, and curve 504 is a similar plot of inductance for P=32. Curve 512 in FIG. 5B shows quality factor, Q, varying as a function of the width of conductor strips 220 for P=16, and curve 514 is variance of Q for P=32.

Consideration can also given to how the vector inductor 100 is ideally configured to connect to other components to make up RF circuits of various types.

Figure 6:
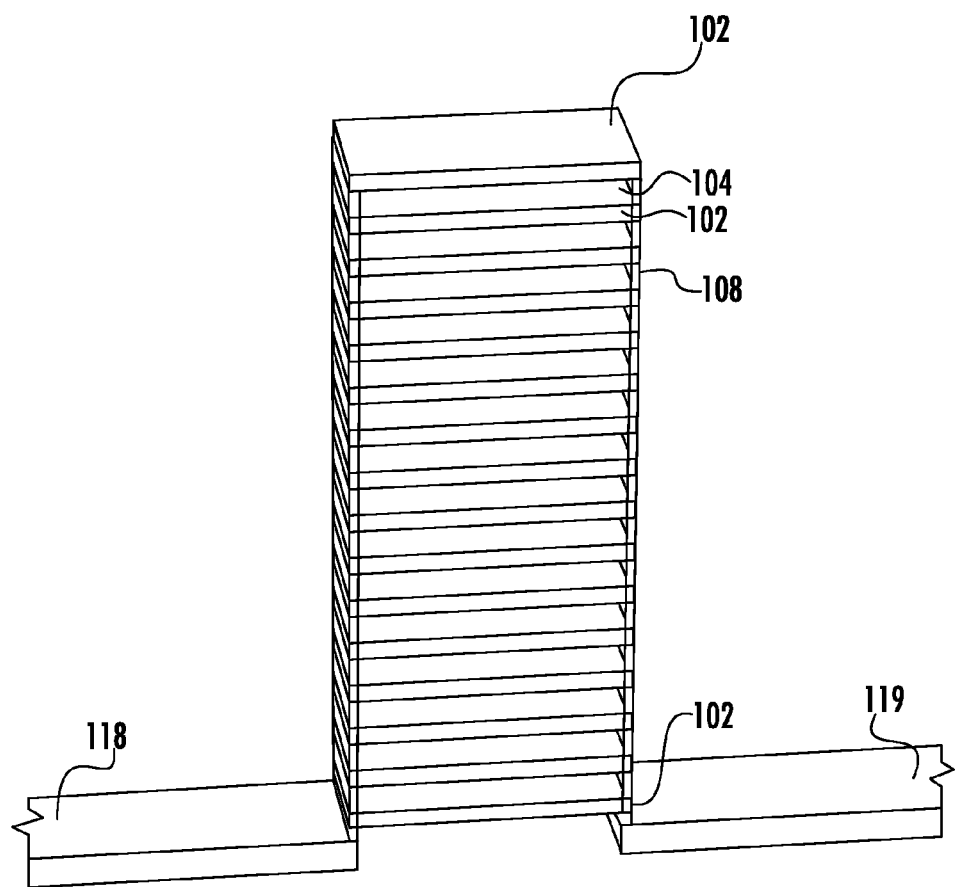
FIG. 6 is an isometric view of a vector inductor component.

FIG. 6 is an implementation of a vector inductor 100 intended for packaging as a separate or standalone discrete component. As seen in this isometric view (where the vertical scale is somewhat exaggerated from the actual scale) the conductors 102 stacked above one another and closely spaced apart by dielectric layers 104 are again seen as in the prior embodiments. Conductive sidewalls 108 are disposed between the conductors 102 and/or along the sides of another structure that supports conductors 102. These additional connections provided by the conductive sidewalls 108 may further assist with encouraging mutual inductance between conductors 102. Here an input terminal 118 and output terminal 119 are connected adjacent the bottom-most one of the conductors 102.

In order to maintain overall compact size, certain designs are preferred for a vector inductor that is to be incorporated into a series or parallel resonant circuit. As understood by those of skill in the art, a resonant circuit may implement a filter that typically includes several inductors and capacitors, with the number of inductors and capacitors in the filter and their specific interconnection depends upon the type of filtering desired {band pass, low pass, high pass, band stop, etc.} and also depending upon the number of poles and zeros desired for such a filter. The discussion below is not concerned with that aspect of filter design, but rather the physical configuration and electrical connection of each individual inductor and capacitor component.

Figure 7A:
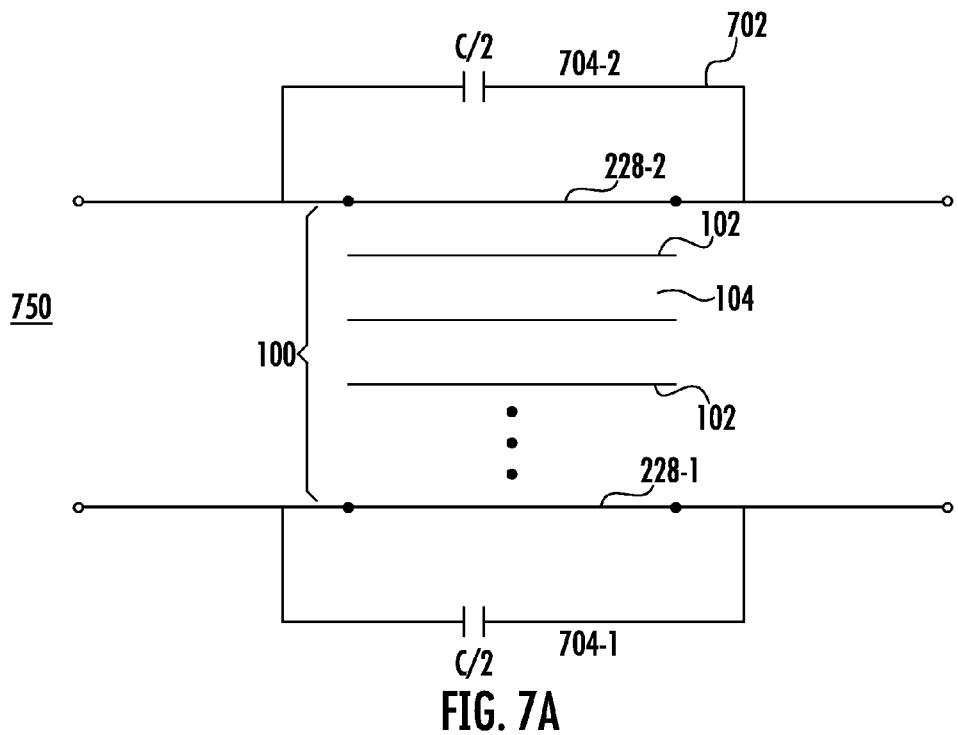
FIGS. 7A and 7B, respectively, show one possible way to connect the vector inductor in a parallel resonant circuit and series resonant circuit.

FIG. 7A is a schematic diagram of one such possible implementation of a parallel LC resonant circuit 702. Shown are the vector inductor 100 including conductors 102 and dielectric layers 104; the inductor 100 again includes a lower most conductor 228-1 and uppermost conductor 228-2. The capacitor C is provided by a pair of capacitor elements 704-1 and 704-2, each of capacitance C/2, with each capacitor respectively connected in parallel with a respective one of the bottom conductor 228-1 and top conductor 228-2. Note that the innermost conductors 102 of vector inductor 100 are not connected to one another in this implementation, nor are they connected to one another. It is thought that this configuration may provide the highest possible Q.

Figure 7B:
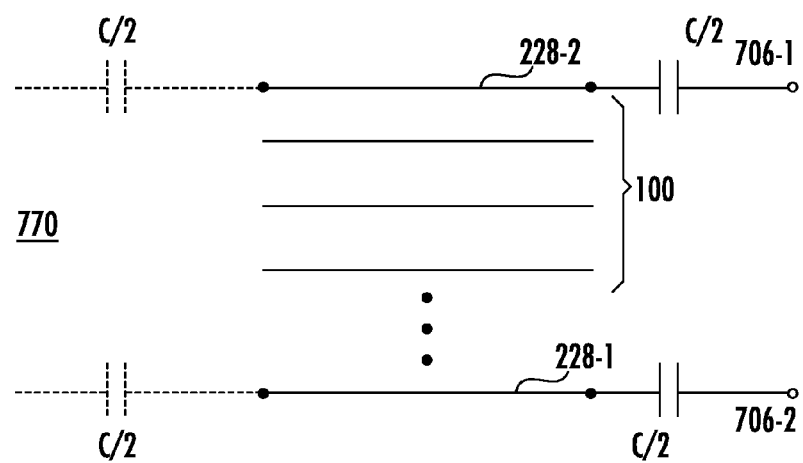

FIG. 7B is an implementation for a series LC circuit that is similar to the parallel LC circuit of FIG. 7A. Again, the capacitors 706-1, 706-2 are only connected to the bottommost 228-1 and topmost 228-2 conductors. The capacitors 706-1 and 706-2 may each have one-half the capacitance C desired in the series LC circuit.

Figure 8A:
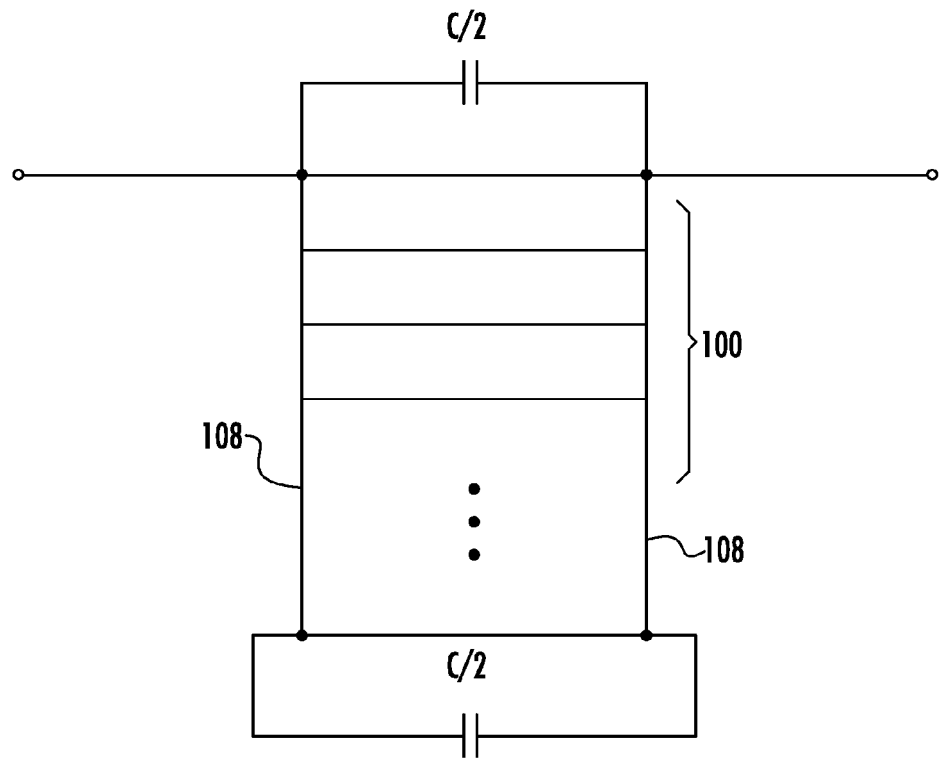
FIGS. 8A and 8B show another way to connect the vector inductor in parallel and series resonant circuits.
Figure 8B:
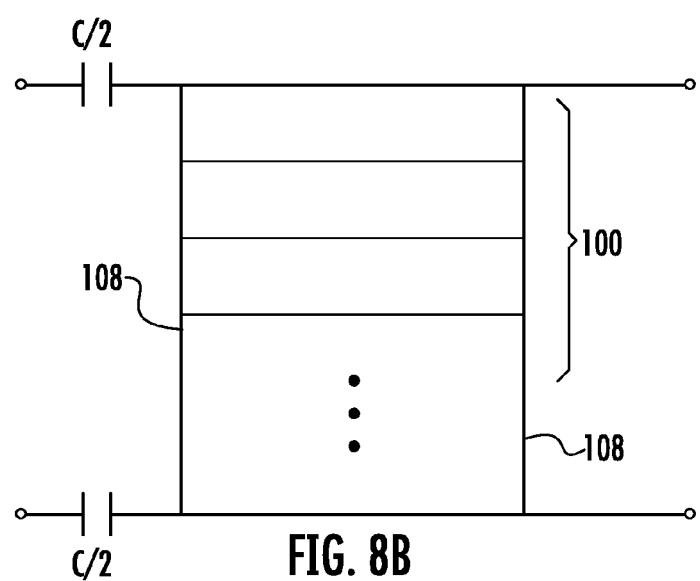

Also possible are implementations for a parallel LC circuit, in the case of FIG. 8A and a series LC circuit in the case of FIG. 8B. The difference over FIGS. 7A and 7B is that the vector inductors 100 are implemented using conductive sidewalls 108. While this configuration may not provide the optimum performance characteristics, it may still be acceptable in some applications to make construction easier.

Figure 9:
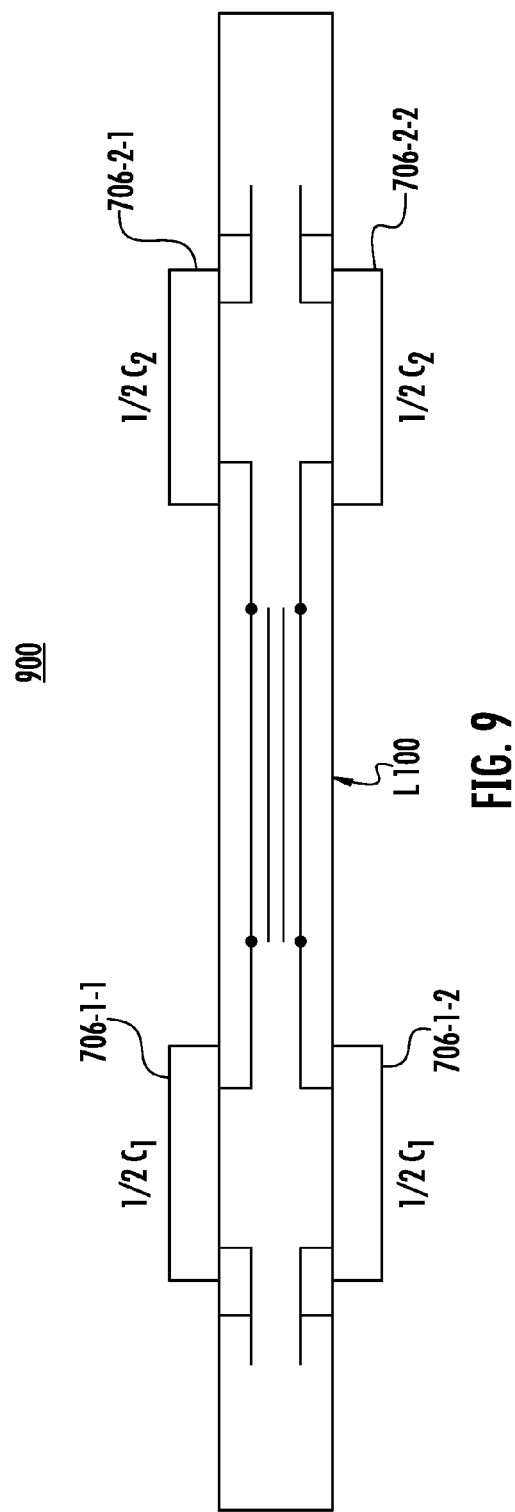
FIG. 9 is a cross sectional view of a series resonant circuit implementation of the vector inductor using a printed circuit board substrate and integrated circuit capacitors.

FIG. 9 is a more detailed cross-sectional view of a series resonant circuit 900 consisting of a single vector inductor 100 and pair of capacitances C1 and C2. This series resonant circuit 900 is constructed according to the principles shown in FIG. 7B but now shown in greater detail with integrated circuit (IC) chip type capacitors 706-1-1, 706-1-2 providing capacitance C1 and capacitors 706-2-1, 706-2-2 providing capacitance C2. This layout is particularly adaptable for implementation of the vector inductor 100 in a multi-layer printed circuit board (PCB) substrate 770 (FIG. 7b) which may be a FaradFlex, or other suitable multi-layer substrates. The capacitors 706-1 and 706-2 may be IC chip components mounted on top of the PCB substrate 750 as "flip chips". One preferred implementation of the capacitor chips 706 uses the CMOS capacitor array architecture described in the patent applications incorporated by reference above.

Figure 10:
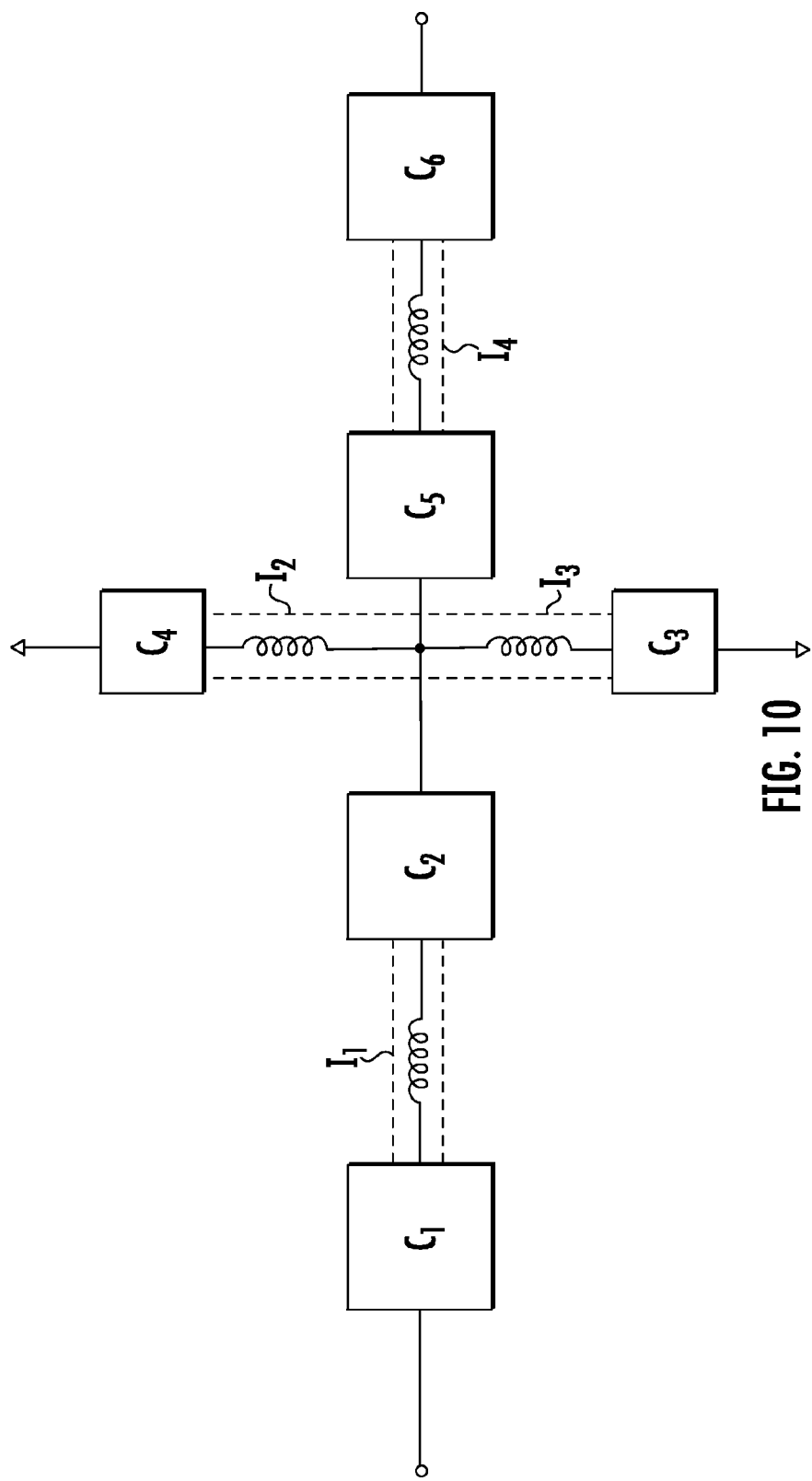
FIG. 10 is a top level view of an example Chebyshev filter implemented on a printed circuit board using the vector inductor and integrated circuit capacitors.

FIG. 10 is a top level view of a more complex filter design using the same principals of FIG. 9. Here a set of chip capacitors C1, C2, C3, C4, C5, C6 are connected with a set of inductors I1, I2, I3, I4 to provide a Chebychev filter. Each of inductors I1, I2, I3, I4 may be implemented within a PCB substrate as a vector inductor 100. Each of the inductors may have a different shape to realize a different inductance to realize the desired filter response.

While various embodiments of the invention have now been particularly shown in the drawings and described in the text above, it will be understood by those skilled in the art that various changes in form and details may be made therein without departing from the scope of the invention. It is intended, therefore, that the invention be limited only by the claims that follow.

What is claimed is:

1. An inductor apparatus comprising:
    multiple subassemblies including a plurality of conductive elements and a dielectric; the plurality of conductive elements having similar dimensions, each formed as an individual patch of conductive material without a curved propagation path, the plurality of conductive elements arranged in a vertical stack with respect to one another, wherein the plurality of conductive elements comprise a top conductive element, a bottom conductive element, and one or more inner conductive elements of the vertical stack; and
    the dielectric disposed between at least two or more adjacent conductive elements of the plurality of conductive elements, the dielectric being sufficiently thin so as to provide a mutual inductance factor of at least one-half (½) or greater between the at least two or more adjacent conductive elements of the plurality of conductive elements, wherein the dielectric has a thickness less than a thickness of each of the at least two or more adjacent conductive elements of the plurality of conductive elements,
    wherein the multiple subassemblies are attached to one another with one or more adhesive layers.

2. The apparatus of claim 1 wherein a relative permittivity of the dielectric disposed between the at least two or more adjacent conductive elements in at least one of the multiple subassemblies exhibits a dielectric loss tangent (Tand) much less than 1.

3. The apparatus of claim 1 wherein each of the plurality of conductive elements of at least one of the multiple subassemblies are electrically connected to one another by a plurality of sidewalls.

4. A parallel resonant circuit comprising the inductor apparatus of claim 1, wherein the parallel resonant circuit comprises a first capacitor connected to the top conductive element of at least one of the multiple subassemblies of the inductor apparatus, and wherein the parallel resonant circuit further comprises a second capacitor connected to the bottom conductive element of at least one of the multiple subassemblies of the inductor apparatus.

5. The apparatus of claim 1 wherein the one or more inner conductive elements of the vertical stack of at least one of the multiple subassemblies comprises a plurality of inner conductive elements.

6. A series resonant circuit comprising the inductor apparatus of claim 1, wherein the series resonant circuit comprises a first capacitor connected to the top conductive element of at least one of the multiple subassemblies of the inductor apparatus, and wherein the series resonant circuit comprises a second capacitor connected to the bottom conductive element of at least one of the multiple subassemblies of the inductor apparatus.

7. The apparatus of claim 1 wherein at least one of the top conductive element or the bottom conductive element of the stack of at least one of the multiple subassemblies is thicker than each of the one or more inner conductive elements of the vertical stack of at least one of the multiple subassemblies.

8. The apparatus of claim 1 further comprising a printed circuit board substrate, wherein the dielectric comprises a dielectric layer of the printed circuit board substrate, and wherein the top conductive element of at least one of the multiple subassemblies includes a first metal layer of the printed circuit board substrate, wherein the bottom conductive element of at least one of the multiple subassemblies includes a second metal layer of the printed circuit board substrate.

9. The apparatus of claim 8 wherein the printed circuit board substrate comprises an embedded capacitor layer.

10. An inductor apparatus comprising:
    multiple subassemblies including a plurality of conductors and a thin dielectric; the plurality of conductors having similar dimensions, each formed as an individual patch of conductive material without a curved propagation path, the plurality of conductors arranged vertically with respect to one another to form a conductor stack, wherein the plurality of conductors comprise an uppermost conductor, a bottommost conductor, and one or more inner conductors of the conductor stack; and
    the thin dielectric disposed between two or more adjacent conductors of the plurality of conductors, the thin dielectric having a thickness less than a thickness of each of the two or more adjacent conductors of the plurality of conductors, wherein the multiple subassemblies are attached to one another with one or more adhesive layers.

11. The apparatus of claim 10 wherein the one or more inner conductors of the vertical stack of at least one of the multiple subassemblies comprises a plurality of inner conductors.

12. The apparatus of claim 10 wherein each of the plurality of conductors are formed from a generally rectangular strip of metal.

13. The apparatus of claim 10 wherein each of the plurality of conductors comprises a metal strip that includes a first stub on a first end of the respective metal strip and a second stub on a second end of the respective metal strip opposite to the first end.

14. The apparatus of claim 10 wherein each of the plurality of conductors have a thickness in a range of from about 0.33 mils to 0.7 mils.

15. The apparatus of claim 10 wherein the thin dielectric of at least one of the multiple subassemblies has a thickness in a range of from 0.3 to 0.315 mils.

16. The apparatus of claim 10 wherein at least one of the uppermost conductor or the bottommost conductor of the stack of at least one of the multiple subassemblies is thicker than each of the one or more inner conductors of the stack of at least one of the multiple subassemblies.

17. The apparatus of claim 10 wherein the plurality of conductors of at least one of the multiple subassemblies have a width in a range of from 40 to 80 mils.

* * * * *